(12) United States Patent
Choi et al.

(10) Patent No.: US 10,056,520 B2
(45) Date of Patent: Aug. 21, 2018

(54) PHOTODIODE USING GRAPHENE-SILICON QUANTUM DOT HYBRID STRUCTURE AND METHOD OF MANUFACTURING THE SAME

(71) Applicant: UNIVERSITY-INDUSTRY COOPERATION GROUP OF KYUNG HEE UNIVERSITY, Yongin-si, Gyeonggi-do (KR)

(72) Inventors: Suk Ho Choi, Suwon-si (KR); Dong Hee Shin, Cheonan-si (KR); Sung Kim, Suwon-si (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 15/502,807

(22) PCT Filed: Nov. 20, 2014

(86) PCT No.: PCT/KR2014/011176
§ 371 (c)(1),
(2) Date: Feb. 9, 2017

(87) PCT Pub. No.: WO2016/027934
PCT Pub. Date: Feb. 25, 2016

(65) Prior Publication Data
US 2017/0250304 A1  Aug. 31, 2017

(30) Foreign Application Priority Data
Aug. 21, 2014 (KR) .................. 10-2014-0108712

(51) Int. Cl.
*H01L 31/18* (2006.01)
*C01B 31/04* (2006.01)
(Continued)

(52) U.S. Cl.
CPC ...... *H01L 31/1804* (2013.01); *C01B 31/0453* (2013.01); *C01B 31/0484* (2013.01);
(Continued)

(58) Field of Classification Search
None
See application file for complete search history.

(56) References Cited

U.S. PATENT DOCUMENTS 7,005,669 B1  2/2006  Lee
8,554,022 B1  10/2013  Hochberg et al.
(Continued)

FOREIGN PATENT DOCUMENTS

CN  101000874 A   7/2007
CN  101281884 A  10/2008
(Continued)

OTHER PUBLICATIONS

Xiaohong An et al., "Tunable Graphene-Silicon Heterojunctions for Ultrasensitive Photodetection," Nano Letters, 2013, pp. 909-916, vol. 13.
(Continued)

*Primary Examiner* — Thao P Le
(74) *Attorney, Agent, or Firm* — Sughrue Mion, PLLC

(57) ABSTRACT

Disclosed is a photodiode, which includes a graphene-silicon quantum dot hybrid structure, having improved optical and electrical characteristics by controlling the sizes of silicon quantum dots and the doping concentration of graphene. The photodiode including the graphene-silicon quantum dot hybrid structure of the present disclosure may be easily manufactured, may be manufactured over a large area, has a wide photodetection band from the ultraviolet light region to the near infrared region, and allows selective absorption energy control.

7 Claims, 14 Drawing Sheets

(51) Int. Cl.
  *H01L 31/0352* (2006.01)
  *H01L 31/0288* (2006.01)
  *H01L 31/109* (2006.01)
  *B82Y 40/00* (2011.01)
  *B82Y 30/00* (2011.01)

(52) U.S. Cl.
  CPC .... *H01L 31/0288* (2013.01); *H01L 31/03529* (2013.01); *H01L 31/035218* (2013.01); *H01L 31/109* (2013.01); *B82Y 30/00* (2013.01); *B82Y 40/00* (2013.01); *Y10S 977/734* (2013.01); *Y10S 977/774* (2013.01); *Y10S 977/814* (2013.01); *Y10S 977/843* (2013.01); *Y10S 977/847* (2013.01); *Y10S 977/89* (2013.01); *Y10S 977/896* (2013.01); *Y10S 977/948* (2013.01)

(56) References Cited

U.S. PATENT DOCUMENTS

| | | | | |
|---|---|---|---|---|
| 8,563,965 | B2* | 10/2013 | Bowers | H01L 21/04 257/29 |
| 8,742,398 | B2 | 6/2014 | Klem et al. | |
| 9,318,632 | B2* | 4/2016 | Lewis | H01L 31/18 |
| 2003/0127655 | A1* | 7/2003 | Choi | B82Y 10/00 257/79 |
| 2010/0019334 | A1* | 1/2010 | Ivanov | H01L 31/032 257/432 |
| 2010/0019335 | A1* | 1/2010 | Ivanov | H01L 31/0296 257/432 |
| 2013/0032782 | A1* | 2/2013 | Gerasimos | B82Y 10/00 257/21 |
| 2014/0007930 | A1* | 1/2014 | Kim | H01L 31/035218 136/255 |
| 2014/0151631 | A1 | 6/2014 | Duesberg et al. | |
| 2014/0291479 | A1* | 10/2014 | Lu | H01L 31/035218 250/200 |
| 2014/0299741 | A1* | 10/2014 | Colli | H01L 31/035218 250/200 |

FOREIGN PATENT DOCUMENTS

| | | |
|---|---|---|
| CN | 103443930 A | 12/2013 |
| CN | 103618037 A | 3/2014 |
| JP | 2000133795 A | 5/2000 |
| KR | 10-2012-0059063 A | 6/2012 |
| KR | 10-2013-0056011 A | 5/2013 |

OTHER PUBLICATIONS

Notice of Allowance issued in KR 10-2014-0108712 dated Sep. 24, 2015.

Communication dated Jul. 31, 2017 from the Chinese Intellectual Property Office in corresponding Chinese Patent Application No. 201480081292.4.

* cited by examiner

PHOTODIODE USING GRAPHENE-SILICON QUANTUM DOT HYBRID STRUCTURE AND METHOD OF MANUFACTURING THE SAME

CROSS-REFERENCE TO RELATED APPLICATIONS

This application is a National Stage of International Application No. PCT/KR2014/011176 filed Nov. 20, 2014, claiming the priority benefit of Korean Patent Application No. 10-2014-0108712, filed on Aug. 21, 2014 in the Korean Intellectual Property Office, the disclosure of which is incorporated herein by reference.

BACKGROUND OF THE INVENTION

Field of the Invention

The present disclosure relates to a photodiode, which includes a graphene-silicon quantum dot hybrid structure, having improved optical and electrical characteristics by controlling the sizes of silicon quantum dots and the doping concentration of graphene, and a method of manufacturing the same.

Description of the Related Art

Graphene, which has superior optical performance as well as high electrical conductivity, has been increasingly utilized in next-generation displays, such as flexible displays and touch panels, in energy industry fields such as solar cells, in various electronics, such as smart windows, RFIDs, and the like.

Over the past several years, graphene has attracted considerable attention due to potential thereof for the growth of industrial technology as well as the development of basic science. In particular, a technique of manufacturing large-area graphene was recently developed, whereby application possibility thereof is increasing.

Among large-area graphene products, graphene manufactured by chemical vapor deposition (CVD), which is widely used in the industry, has a large area and high transmittance and electrical conductivity, thereby being expected to be applied to transparent electrodes.

To utilize graphene in optical and electronic devices, it is necessary to realize a diode structure which is a basic structure of a semiconductor device. In particular, if graphene is developed as a device having a hybrid structure with a silicon-based material widely used in the current industry, the ripple effect will be Very great compared to other materials.

Photodetecting devices or optical sensors, which are photoelectric conversion sensors that convert electromagnetic waves, such as light, into electrical signals, are utilized in various fields such as image sensing, communication, chemical/medical/biological sensing, and aerospace.

A representative material forming the basis of such photodetector devices is silicon Commercial silicon-based photodetector devices can detect light in the ultraviolet, visible, and infrared regions, respectively. Conventional photodetector devices have a limited light detection band, low photoresponsivity, and a low band gap energy of Si, and thus, generate heat under relatively high light energy (from ultraviolet light to visible light region energy), thereby having a problem in that the lifetime of devices is shortened.

Accordingly, research into development of a photodetector device using materials having a large energy bandgap to minimize heat generation due to absorption of light in the ultraviolet and visible ray regions is actively underway.

Especially, if the energy bandgap of silicon, which is the most important material in the industry at present, can be controlled, ripple effect thereof will be enormous. Especially, the quantum confinement effect (QCE) of silicon quantum dots should enable further increased light absorptivity and luminous efficiency in the short wavelength region, compared to bulk single-crystalline silicon (Si). Accordingly, silicon has attracted attention as one of very attractive materials of next-generation optoelectronic devices.

In addition, it is anticipated that very thin and flexible optoelectronic devices will be required in the future, and thus, research thereinto is actively carried out in the industry, academia and industry. In order to realize this, a transparent and flexible substrate should be used. However, since such a substrate is vulnerable to heat, graphene growing at a high temperature may be an alternative.

Further, even if growth is possible at high temperature, the process is complex and high costs caused therefrom are thus unavoidable, whereby there are many restrictions on commercialization.

Accordingly, there is need for a suitable material for next-generation photodetector devices and a structure thereof which will allow a simple manufacturing process, easy fabrication of a transparent and flexible substrate, and exhibition of superior performances such as broadband, high sensitivity, and high detectability.

Until recently, research into photodetector devices based on colloidal quantum dots, such as CdS, CdSe, and PbS, which have superior performance in the visible region, have been reported. Colloidal quantum dot-based photodetector devices have advantages such as a simple fabrication process, low cost, and good sensitivity.

However, colloidal quantum dot-based photodetector devices have disadvantages such as a high operating voltage of 40 to 500V and a slow operating speed. Above all, use of Pb or Cd based materials is limited according to RoHS (Restriction of Specific Hazardous Substances), which took effect from Jul. 1, 2006.

Therefore, it is necessary to design and manufacture a photodetector device with a new structure or to develop a new material for photodetector devices to address the aforementioned problems of conventional photodetector devices.

Recently, research on photodetectors having various new materials and structures have been reported, but there is difficulty in commercializing the same due to low photoresponsivity and detectivity and driving at a relatively high voltage thereof.

Further, several photodetector devices, which have been reported to have superior performance, have a complex manufacturing process and there is a difficulty in manufacturing the same to have a large area.

RELATED DOCUMENTS

Patent Documents

Korean Patent Application Publication No. 2013-0056011 entitled "GRAPHENE BASED PHOTODETECTOR DEVICE COMPRISING COMPLEX TRANSPARENT ELECTRODE, METHOD OF MANUFACTURING THE SAME AND DEVICE COMPRISING THE SAME," published on May 29, 2013.
US Patent Application Publication No. 2014/0151631 entitled "ASYMMETRIC BOTTOM CONTACTED DEVICE," published on Jun. 5, 2014.

Non-Patent Document

Xiaohong An, Fangze Liu, Yung Joon Jung, and Swastik Kar, Nano Lett. 2013, 13, 909-916

SUMMARY OF THE INVENTION

Therefore, the present invention has been made in view of the above problems, and it is an object of the present invention to provide a photodiode including a graphene-silicon quantum dot hybrid structure which may be easily manufactured, may be manufactured over a large area, has a wide photodetection band from the ultraviolet light region to the near infrared region, and allows selective absorption energy control and a method of manufacturing the same.

It is another object of the present invention to provide a photodiode including a graphene-silicon quantum dot hybrid structure which optimizes the performance of a photodetector device by controlling the doping concentration of graphene and thus controlling the Fermi level of the graphene and a method of manufacturing the same.

It is another object of the present invention to provide a photodiode including a graphene-silicon quantum dot hybrid structure which has improved performance by controlling the sizes of silicon quantum dots and thus controlling the energy bandgap thereof.

It is yet another object of the present invention to provide an ideal photodiode including a graphene-silicon quantum dot hybrid structure which may be utilized in photodiode-based optoelectronic devices.

In accordance with the present invention, the above and other objects can be accomplished by the provision of a photodiode including a graphene-silicon quantum dot hybrid structure, the photodiode including: a hybrid structure composed of a silicon quantum dot layer including silicon (Si) quantum dots, each of which is formed in a thin film of a silicon oxide, and doped graphene formed on the silicon quantum dot layer; and an electrode formed upper and lower parts of the hybrid structure, wherein optical and electrical characteristics of the photodiode are controlled according to the size of the silicon quantum dots and a doping concentration of the doped graphene.

The silicon quantum dot layer may include silicon quantum dots formed in a $SiO_2$ thin film by sequentially laminating $SiO_2$ and SiOx thin films on a substrate and then thermally treating at 1000° C. to 1200° C. in a nitrogen atmosphere.

x may be controlled to have a value of 0.8 to 1.6 and the size of the silicon quantum dots may be controlled to correspond to a value of x.

Each of the $SiO_2$ and SiOx thin films may be sequentially laminated 23 to 25 times to a thickness unit of 2 nm each time.

A doping concentration of the doped graphene may be controlled by treating graphene formed by reacting a catalyst layer with a mixed gas containing carbon and depositing a reacted product on the catalyst layer by chemical vapor deposition (CVD).

The hybrid structure may be formed by transferring the deposited graphene onto the silicon quantum dot layer.

The doped graphene may be formed by spin coating $AuCl_3$, which has a concentration of 10 to 30 mM, on the deposited graphene and performing annealing at 90° C. to 110° C.

It is another object of the present invention to provide a method of manufacturing a photodiode including a graphene-silicon quantum dot hybrid structure the method including: a step of forming a silicon quantum dot layer including silicon quantum dots, each of which is formed in a thin film of a silicon oxide, on a substrate; a step of forming a hybrid structure by forming doped graphene on the silicon quantum dot layer; and a step of forming an electrode on upper and lower parts of the hybrid structure.

The step of forming the silicon quantum dot layer may include a step of sequentially laminating $SiO_2$ and SiOx thin films on a substrate and then thermally treating at 1000° C. to 1200° C. in a nitrogen atmosphere to form the silicon quantum dots in the $SiO_2$ thin film. Here, x may be controlled to have a value of 0.8 to 1.6 and the sizes of the silicon quantum dots may be controlled to correspond to a value of x.

The step of forming the hybrid structure may include a step of forming graphene on a catalyst layer by reacting the catalyst layer with a mixed gas containing carbon and thus performing deposition by chemical vapor deposition (CVD); a step of transferring the formed graphene on the silicon quantum dot layer; and a step of doping graphene by spin-coating $AuCl_3$ at a concentration of 10 to 30 mM, and performing annealing at 90° C. to 110° C.

BRIEF DESCRIPTION OF THE DRAWINGS

The above and other objects, features and other advantages of the present invention be more clearly understood from the following detailed description taken in conjunction with the accompanying drawings, in which.

DETAILED DESCRIPTION OF THE INVENTION

Figure 1:
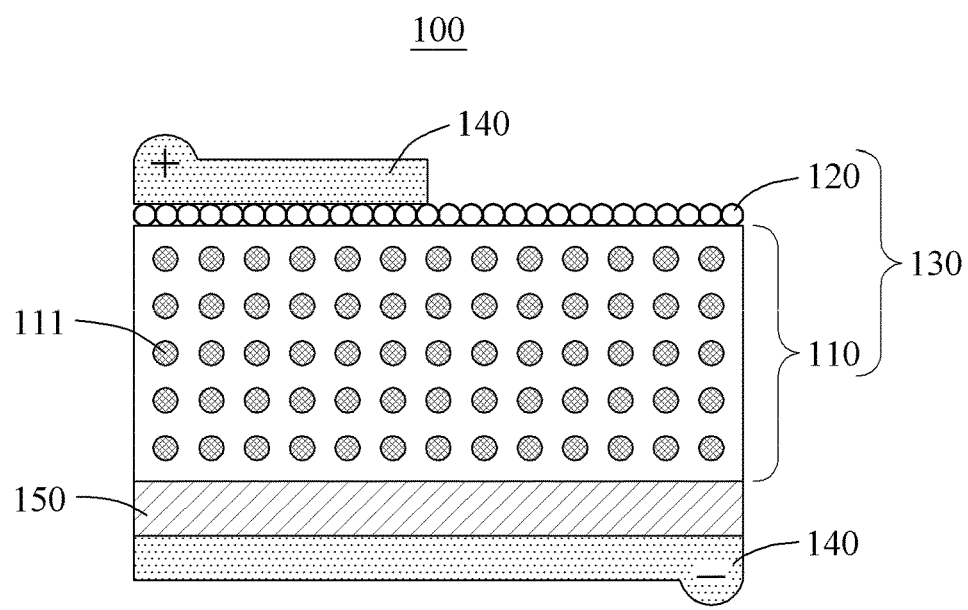
FIG. 1 illustrates a photodiode including a graphene-silicon quantum dot hybrid according to an embodiment of the present disclosure.

Hereinafter, the embodiments of the present invention are described with reference to the accompanying drawings and the description thereof but are not limited thereto.

It will be understood that when an element or layer is referred to as being "on" another element or layer, it can be directly on the other element or layer or intervening elements or layers may be present therebetween. In contrast, when an element or layer is referred to as being "directly on" another element or layer, there are no intervening elements or layers present.

Spatially-relative terms such as "below", "beneath", "lower", "above" or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure serves the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "includes" and/or "including," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

FIG. 1 illustrates a photodiode including a graphene-silicon quantum dot hybrid according to an embodiment of the present disclosure.

Referring to FIG. 1, a photodiode 100 including a graphene-silicon quantum dot hybrid structure according to an embodiment of the present disclosure includes a hybrid structure 130, which is based on doped graphene 130 and silicon quantum dots 111, and electrodes 140, which are formed on upper and lower parts of the hybrid structure 130.

Optical and electrical characteristics of the photodiode 100 including a graphene-silicon quantum dot hybrid structure according to an embodiment of the present disclosure are controlled according to the sizes of the silicon quantum dots 111 and a doping concentration of the doped graphene 130.

The hybrid structure 130 includes a silicon quantum dot layer 110 including the silicon quantum dots 111, each of which is formed inside a thin film of silicon oxide; and doped graphene 120 formed on the silicon quantum dot layer 110.

A doping concentration of the doped graphene 120 may be controlled by treating graphene formed by reacting a catalyst layer with a mixed gas containing carbon and depositing a reacted product on the catalyst layer by chemical vapor deposition (CVD).

For example, the doping concentration of the doped graphene 120 may be controlled by spin coating $AuCl_3$ with a concentration of 10 to 30 mM on the deposited graphene, followed by annealing at 90° C. to 110° C.

According to another embodiment of the present disclosure, the hybrid structure 130 may be formed by transferring the deposited graphene onto the silicon quantum dot layer 110.

The silicon quantum dot layer 110 may include the silicon quantum dots 111 formed in a $SiO_2$ thin film by sequentially stacking $SiO_2$ and SiOx thin films on the substrate 150 and then thermally treating at 1000° C. to 1200° C. in a nitrogen atmosphere. x may be controlled to have a value of 0.8 to 1.6 and the sizes of the silicon quantum dots 111 may be controlled to correspond to a value of x.

In addition, the $SiO_2$ and SiOx thin films may be sequentially laminated 23 to 25 times to a thickness of 2 mm each time, respectively.

FIGS. 2A to 2E illustrate a process of manufacturing a photodiode including the graphene-silicon quantum dot hybrid structure according to an embodiment of the present disclosure.

<Manufacture of Silicon Quantum Dots>

As illustrated in FIG. 1, the photodiode including a graphene-silicon quantum dot hybrid structure includes the silicon quantum dot layer 110 including the silicon quantum dots 111, each of which is formed inside a thin film of a silicon oxide.

Figure 2A:
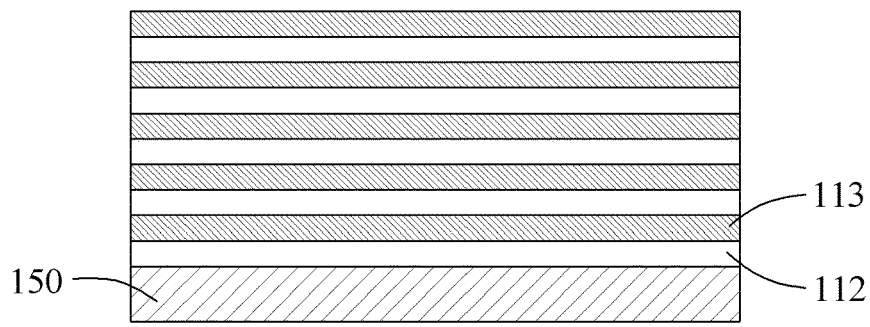
FIGS. 2A to 2E illustrate a process of manufacturing a photodiode including the graphene-silicon quantum dot hybrid structure according to an embodiment of the present disclosure.
Figure 2B:
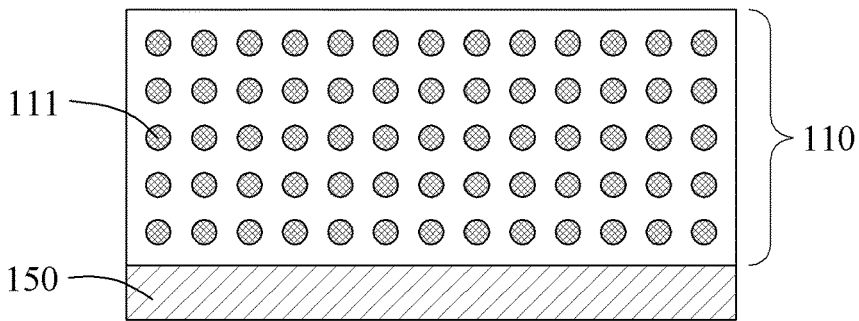

Referring to FIGS. 2A and 2B, a method of manufacturing the photodiode including a graphene-silicon quantum dot hybrid structure according to an embodiment of the present disclosure may include a process of forming the silicon quantum dot layer 110 by sequentially stacking SiO$_2$ and SiOx thin films 112 and 113 on the substrate 150 and then thermally treating at 1000° C. to 1200° C. in a nitrogen atmosphere, thereby forming the silicon quantum dots 111 inside the SiO$_2$ thin film 112.

For example, the silicon quantum dot layer 110 may be formed by alternately depositing the SiO$_2$ thin film 112 to a thickness of 2 nm and the SiOx thin film 113 to a thickness of 2 nm at a predetermined cycle on the substrate 150 by ion beam sputtering deposition, followed by rapidly, thermally treating for 20 minutes at 1000° C. to 1200° C. in a nitrogen atmosphere 20. In this case, the SiO$_2$ thin film 112 having a thickness of 2 nm and the SiOx thin film 113 having a thickness of 2 nm may be deposited up to a total thickness of 100 nm through 25 cycles. Here, x is controlled to have a value of 0.8 to 1.6 and the sizes of the silicon quantum dots may be adjusted to correspond to a value of x.

In addition, a value of x may be adjusted by means of an X-ray spectrometer (XPS).

Figure 2C:
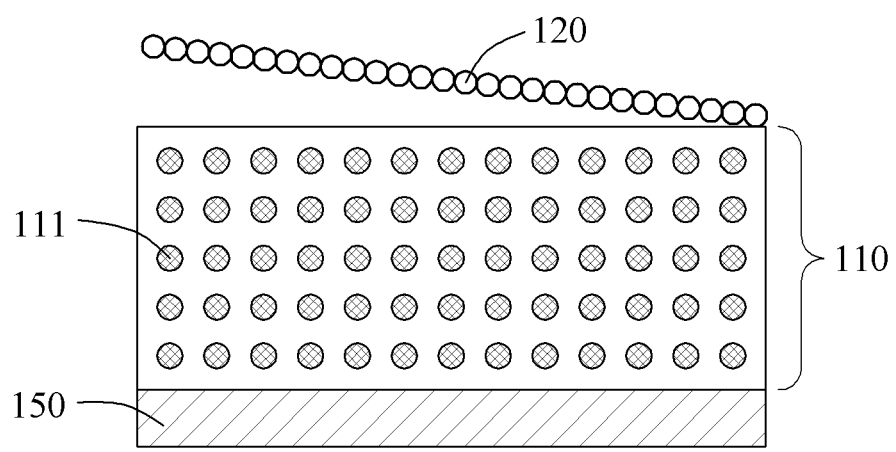
Figure 2D:
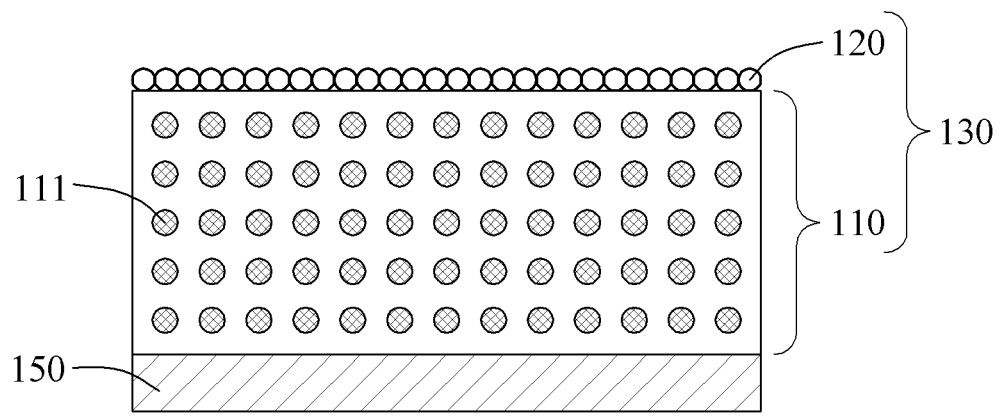

Referring to FIGS. 2C and 2D, a method of manufacturing the photodiode including a graphene-silicon quantum dot hybrid structure according to an embodiment of the present disclosure includes a process of manufacturing a single-layer graphene 120 by chemical vapor deposition and then transferring the manufactured single-layer graphene 120 onto a silicon quantum dot layer 120.

The hybrid structure 130 includes the silicon quantum dot layer 110 including the silicon quantum dots 111, each of which is formed inside a thin film of a silicon oxide, and the doped graphene 120 formed on the silicon quantum dot layer 110.

The doped graphene 120 may be deposited on the catalyst layer by reacting a catalyst layer with carbon-containing gas using chemical vapor deposition (CVD) and a doping concentration thereof may be adjusted. A process of manufacturing the doped graphene will be described in more detail.

<Manufacture of Doped Graphene-Silicon Quantum Dot Hybrid Structure>

A process of manufacturing single-layer graphene by chemical vapor deposition is as follows. Copper (or nickel) utilized as a catalyst layer is deposited on a substrate, followed by reaction with a mixed gas including methane and hydrogen gases at high temperature such that an appropriate amount of carbon is dissolved in or adsorbed onto the catalyst layer. Subsequently, cooling is performed, whereby carbon atoms included in the catalyst layer are crystallized and thus a graphene crystal structure is formed on a metal.

Subsequently, the catalyst layer is separated from the synthesized graphene thin film and thus removed from a substrate, thereby manufacturing a single-layer graphene.

In an example of the present disclosure, a 70 μm copper foil was inserted into a quartz tube, the flow rate of methane gas was changed from 10 sccm to 30 sccm, the flow rate of hydrogen gas was fixed to 10 sccm, and a process pressure was fixed to 3 mTorr, thereby synthesizing graphene.

Subsequently, PMMA, which was prepared by mixing poly(methyl methacrylate) with benzene, was spin-coated on the synthesized graphene. Here, the PMMA coating was performed such that, when the copper foil was removed using an ammonium persulfate solution, PMMA grasped and fixed graphene.

Subsequently, after removing the copper foil from the ammonium persulfate solution, an ammonium persulfate solution remaining on the graphene was washed using DI water. The washed graphene was transferred onto a 300 nm SiO$_2$/Si substrate.

Next, after transfer of the graphene onto the SiO$_2$/Si substrate, thermal treatment was performed to increase binding strength between the substrate and the graphene. Subsequently, the PMMA present on the graphene was removed using acetone, and rapid heat treatment was performed by means of a rapid heat treatment machine so as to remove a PMMA residue remaining on a graphene surface. As a result, a single-layer graphene was finally manufactured.

Referring again to FIG. 2C, the method of manufacturing the photodiode including a graphene-silicon quantum dot hybrid structure according to an embodiment of the present disclosure includes, after manufacture of the single-layer graphene 120 by chemical vapor deposition, a process of transferring the manufactured single-layer graphene 120 onto the silicon quantum dot layer 120.

Referring again to FIG. 2D, the doped graphene-silicon quantum dot hybrid structure 130 may be formed by adjusting a doping concentration of the graphene 120 transferred onto the silicon quantum dot layer 120.

In particular, the doped graphene 120 may be manufactured by spin coating a p-type or n-type doping solution on graphene and performing annealing. For example, the doped graphene 120 is formed by spin coating AuCl$_3$ having a concentration of 10 mM to 30 mM on graphene, which has been formed by deposition, and annealing the same at 90° C. to 110° C. for 10 minutes. A doping concentration of the doped graphene 120 may be controlled by adjusting the concentration of AuCl$_3$.

<Manufacture of Photodiode Having Graphene-Silicon Quantum Dot Hybrid Structure>

Figure 2E:
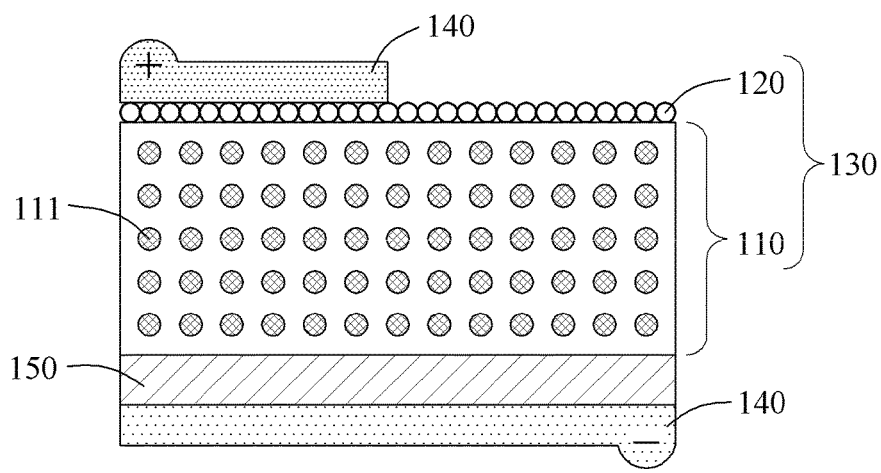
Figure 3A:
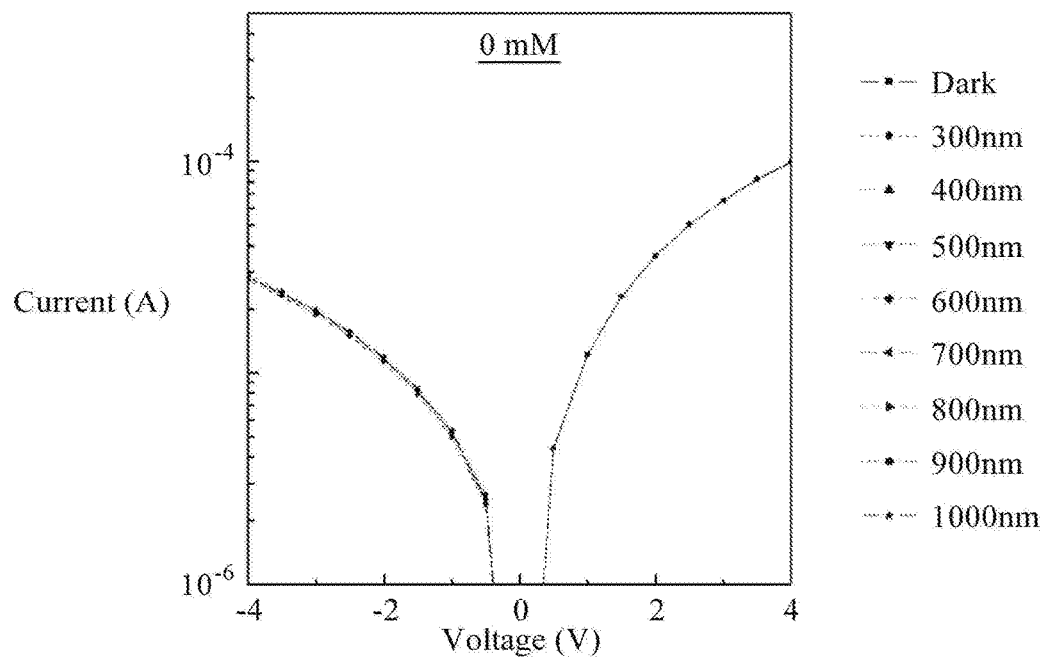
FIGS. 3A to 3F illustrate current-voltage curves, which are dependent upon a change in incident wavelength, of a photodiode including the graphene-silicon quantum dot hybrid structure according to an embodiment of the present disclosure, at different graphene doping concentrations.
Figure 3B:
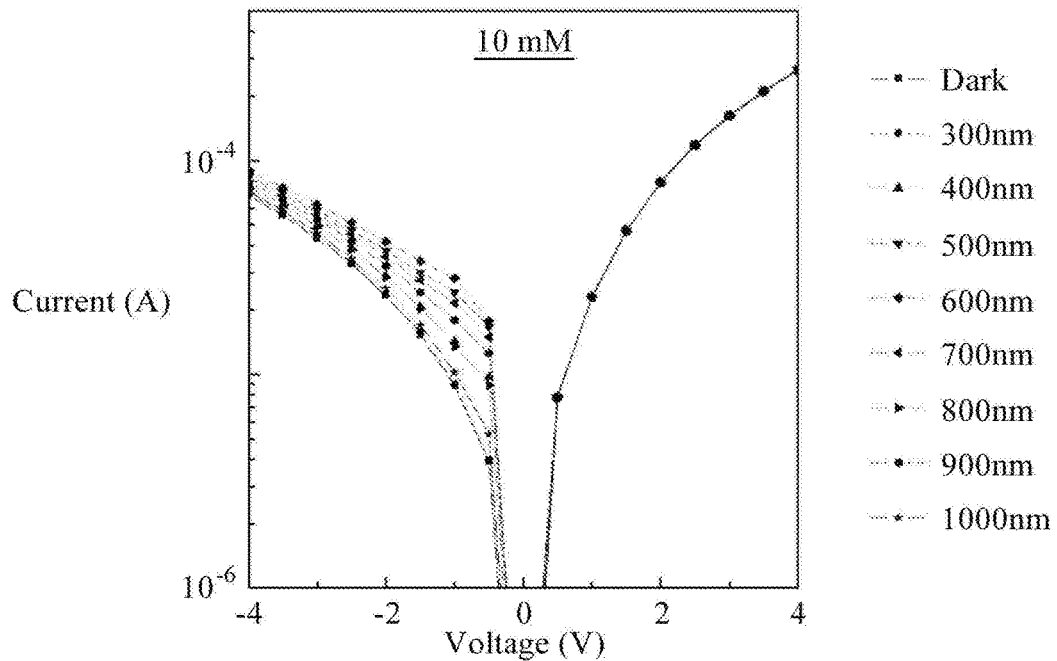
Figure 3C:
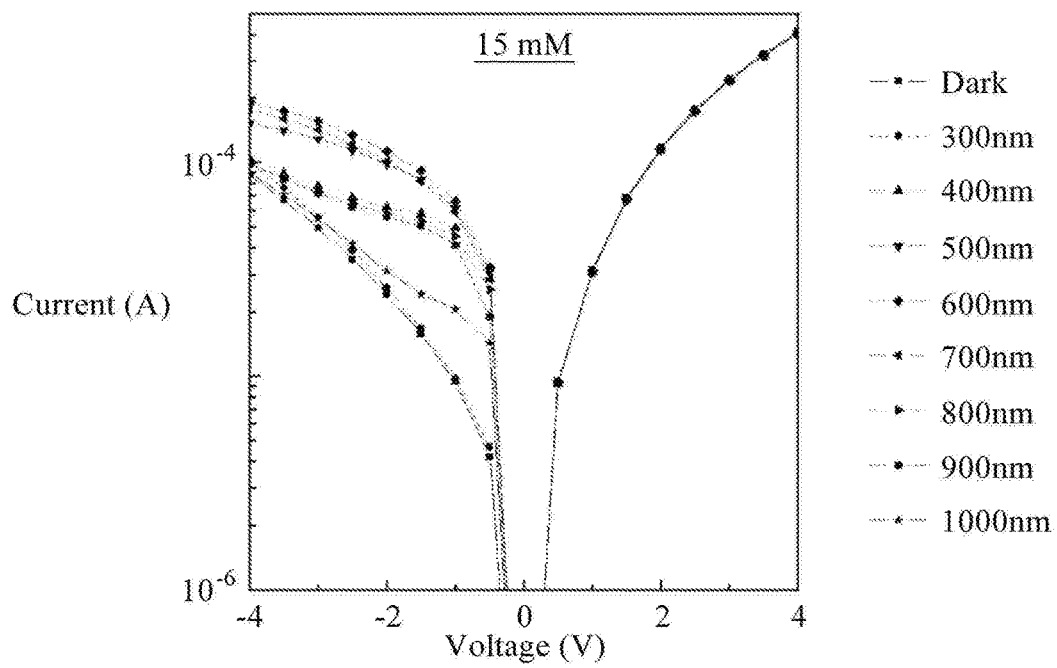
Figure 3D:
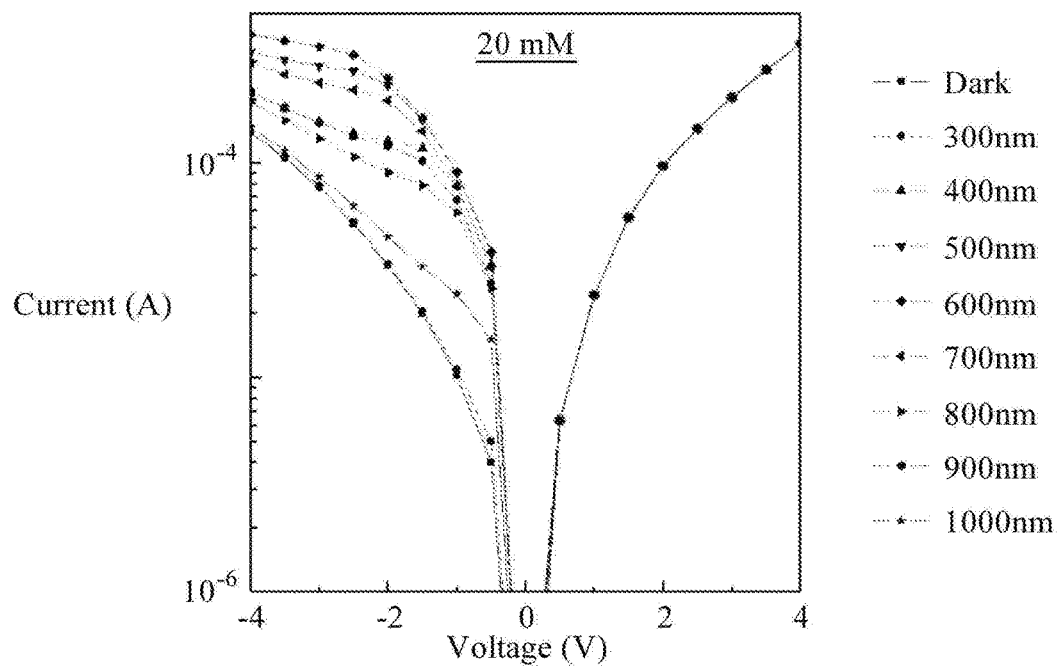
Figure 3E:
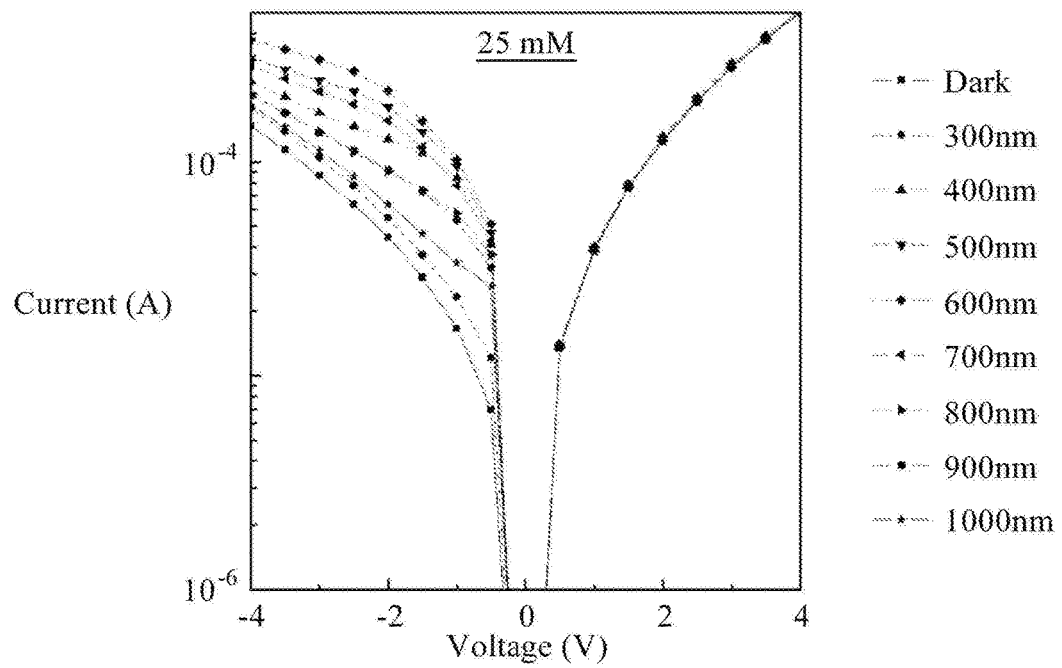
Figure 3F:
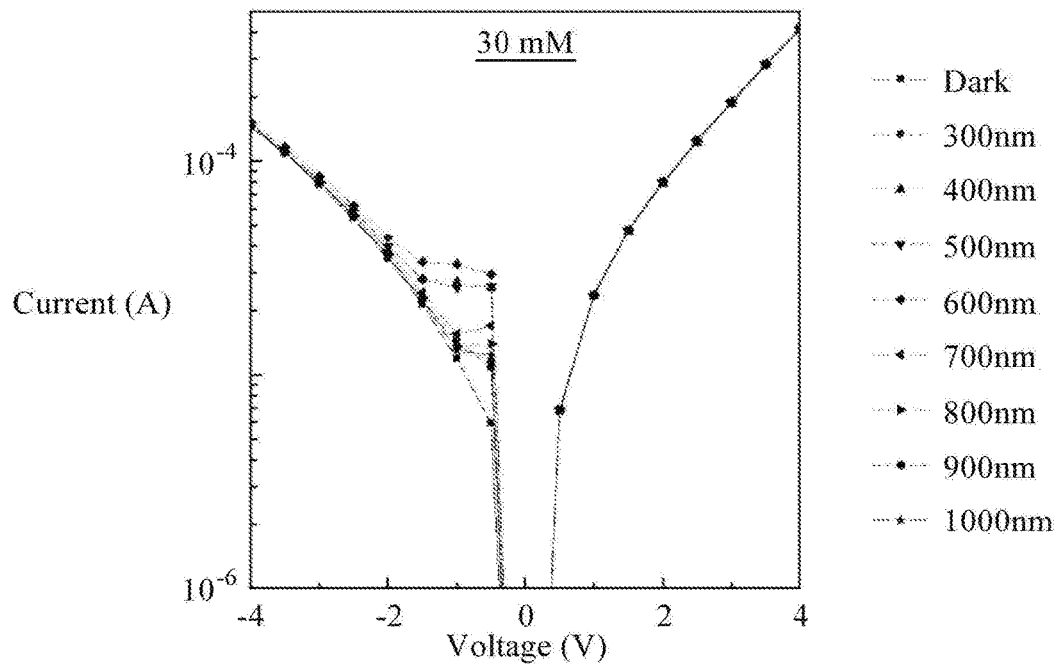

Referring to FIG. 2E, the method of manufacturing the photodiode including a graphene-silicon quantum dot hybrid structure according to an embodiment of the present disclosure includes a process of forming an electrode on upper and lower parts of the doped graphene-silicon quantum dot hybrid structure 130 formed on the substrate according to the process of FIGS. 2A to 2D.

For example, the method of manufacturing the photodiode including a graphene-silicon quantum dot hybrid structure according to an embodiment of the present disclosure may include a process of sequentially depositing a chrome/gold (Cr/Au) metal on upper and lower parts of the doped graphene-silicon quantum dot hybrid structure 130 and thus forming an electrode on each thereof.

FIGS. 3A to 3F illustrate current-voltage curves, which are dependent upon a change in incident wavelength, of a photodiode including the graphene-silicon quantum dot hybrid structure according to an embodiment of the present disclosure, at different graphene doping concentrations.

Referring to FIGS. 3A to 3F, with respect to a photodiode including the graphene-silicon quantum dot hybrid structure according to an embodiment of the present disclosure, light generated from a xenon lamp was incident on a monochromator using a xenon lamp as a light source and then extracted monochromatic light was radiated onto graphene to measure current-voltage characteristics of the photodiode dependent upon wavelength.

Referring to FIGS. 3A to 3F, it can be confirmed that, when reverse voltage is applied to various wavelengths radiated to a photodiode including the graphene-silicon quantum dot hybrid structure according to an embodiment of the present disclosure, a change in photo current is very large.

In addition, it can be confirmed that great change is observed, compared to other doping concentrations, when a great a doping concentration of graphene is 20 mM, and, at all doping concentrations of graphene, a change in photo current is large at a wavelength of 600 nm.

Figure 4A:
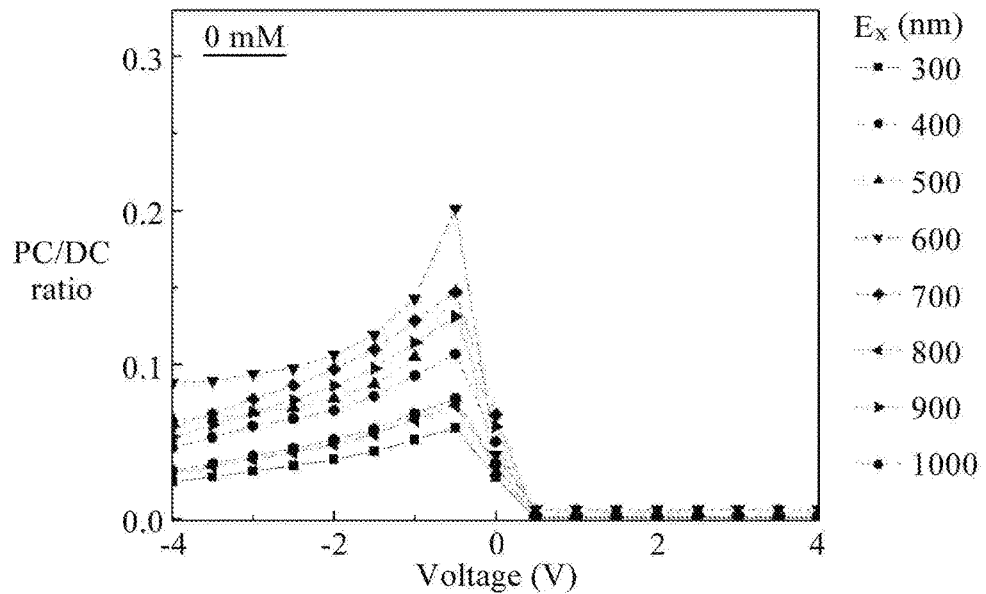
FIGS. 4A to 4C illustrate a graph of a ratio of photo current to dark current for a photodiode including the graphene-silicon quantum dot hybrid structure according to an embodiment of the present disclosure, at different graphene doping concentrations.
Figure 4B:
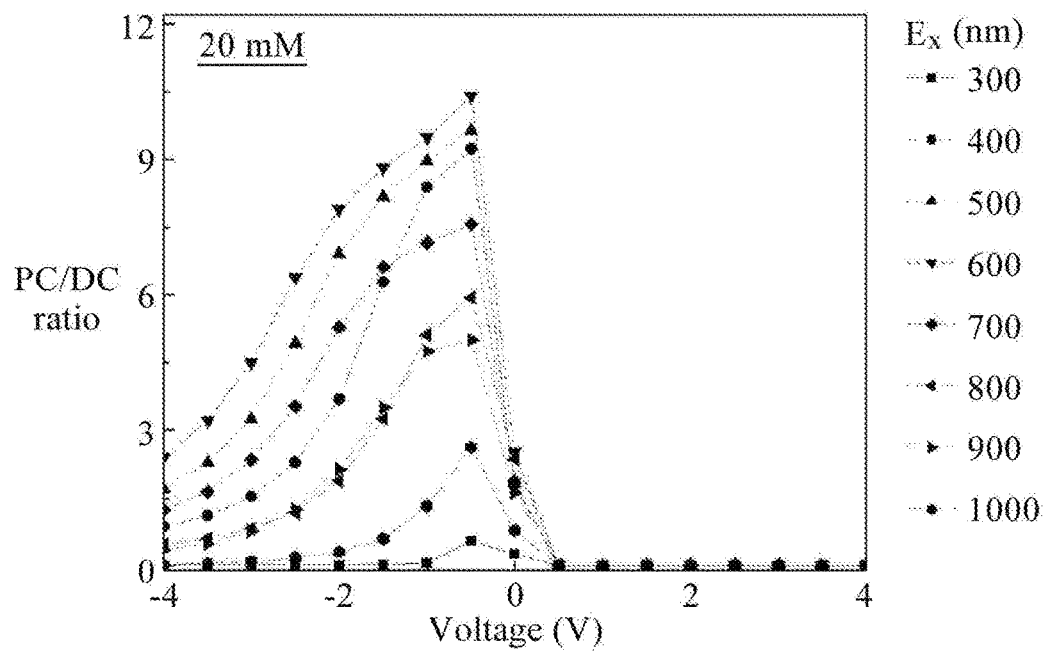
Figure 4C:
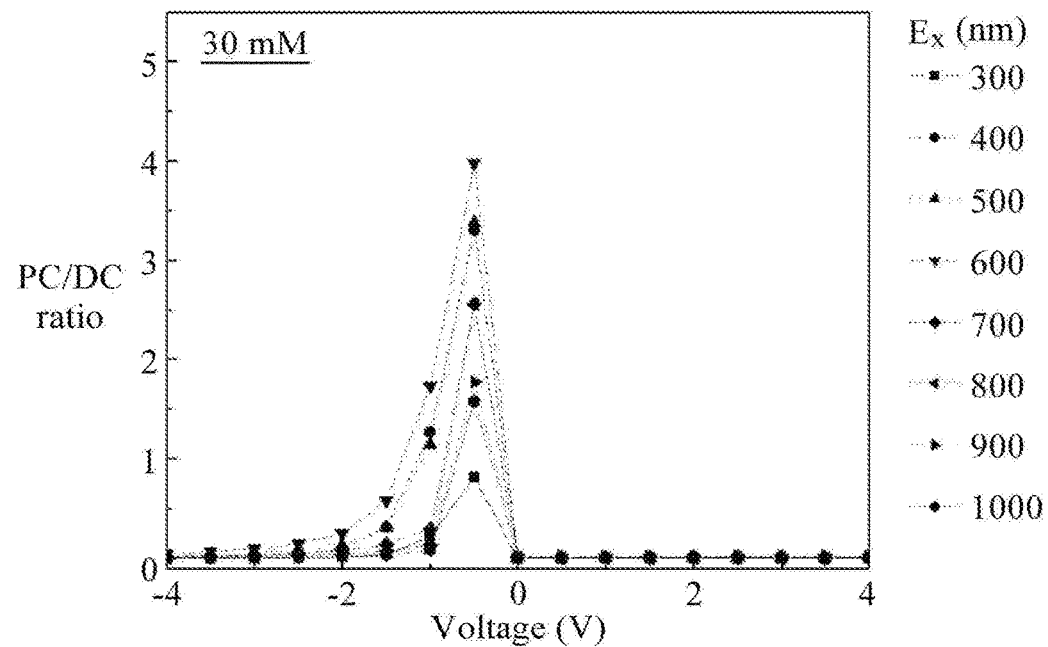

FIGS. 4A to 4C illustrate graphs of a ratio of photo current to dark current for a photodiode including the graphene-silicon quantum dot hybrid structure according to an embodiment of the present disclosure, at different graphene doping concentrations.

Referring to FIGS. 4A to 4C, a ratio of photo current to dark current (PC/DC) was derived from the current-voltage curve, which is dependent upon a change in an incident wavelength and illustrated in FIGS. 3A to 3F, of the photodiode including the graphene-silicon quantum dot hybrid structure according to an embodiment of the present disclosure, and is shown in regard to doping concentrations of graphene.

Referring to FIGS. 4A to 4C, it can be confirmed that the ratio of photo current to dark current (PC/DC) is highest at an applied voltage of about −0.5 V for all incident energy. In particular, it can be confirmed that, when a doping concentration is 20 mM and an incident wavelength is 600 nm, photo current is 11 times greater than dark current.

Compared to a driving voltage. i.e., −15 V, of a generally used silicon-based photodetector, a driving voltage of the photodiode including the graphene-silicon quantum dot hybrid structure according to an embodiment of the present disclosure is very low. Accordingly, applicability of the photodiode including the graphene-silicon quantum dot hybrid structure of the present disclosure is very high.

Figure 5:
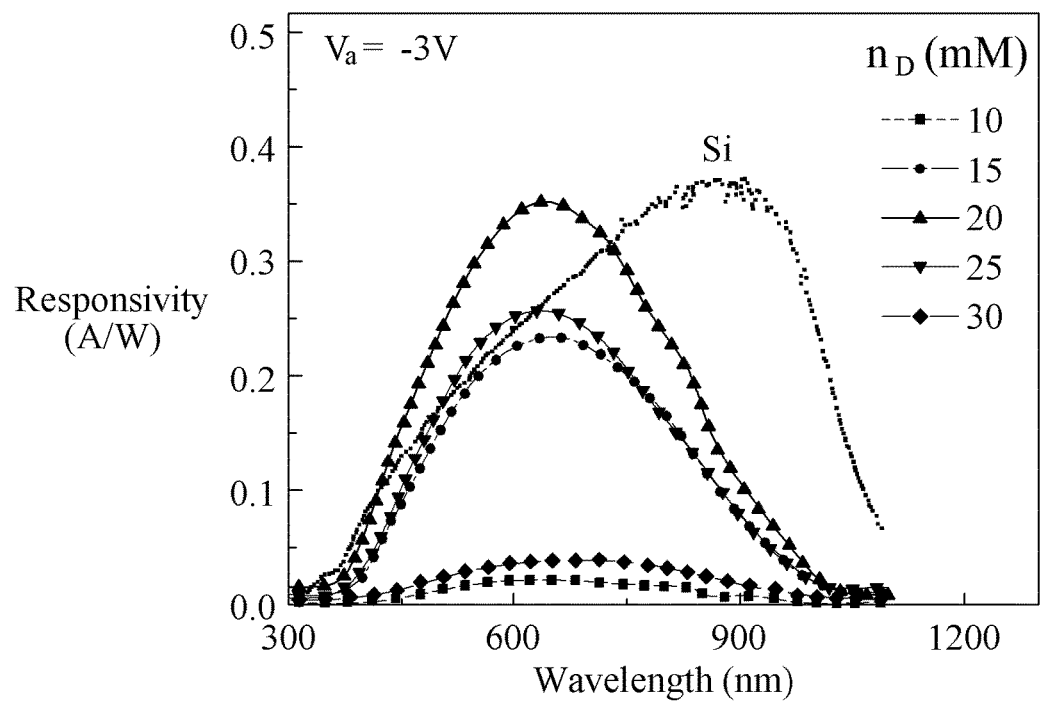
FIG. 5 is a graph showing photoresponsivity, which is dependent upon a doping concentration of graphene, of a photodiode including the graphene-silicon quantum dot hybrid structure according to an embodiment of the present disclosure.
Figure 6:
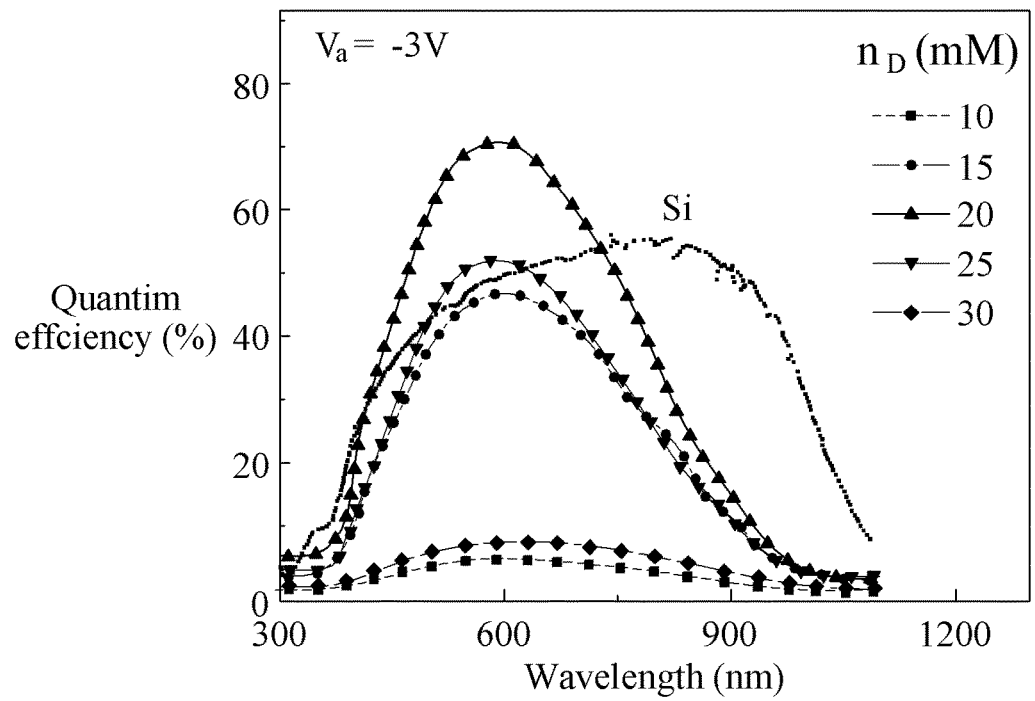
FIG. 6 is a graph showing quantum efficiency, which is dependent upon the doping concentration of graphene, of a photodiode including the graphene-silicon quantum dot hybrid structure according to an embodiment of the present disclosure.

FIG. 5 is a graph showing photoresponsivity, which is dependent upon a doping concentration of graphene, of a photodiode including the graphene-silicon quantum dot hybrid structure according to an embodiment of the present disclosure, and FIG. 6 is a graph showing quantum efficiency, which is dependent upon the doping concentration of graphene, of a photodiode including the graphene-silicon quantum dot hybrid structure according to an embodiment of the present disclosure.

Referring to FIG. 5, a graph labeled "Si" illustrates photoresponsivity of a commercial silicon-based photodetector device. It can be confirmed that the commercial silicon-based photodetector device exhibits highest photoresponsivity at near-ultraviolet light (~950 nm), whereas the photodiode including the graphene-silicon quantum dot hybrid structure according to an embodiment of the present disclosure exhibits higher photoresponsivity than the commercial silicon-based photodetector device in the visible light region.

Such high photoresponsivity of the silicon quantum dots of the photodiode including the graphene-silicon quantum dot hybrid structure according to an embodiment of the present disclosure occurs due to high optical absorption of the silicon quantum dots in the visible light region.

Referring to FIG. 6, a graph labeled "Si" shows photoresponsivity of a commercial silicon-based photodetector device. From the drawing, it can be confirmed that an external quantum efficiency of the photodiode including the graphene-silicon quantum dot hybrid structure according to an embodiment of the present disclosure is superior to the commercial silicon-based photodetector device in the visible light region.

Figure 7:
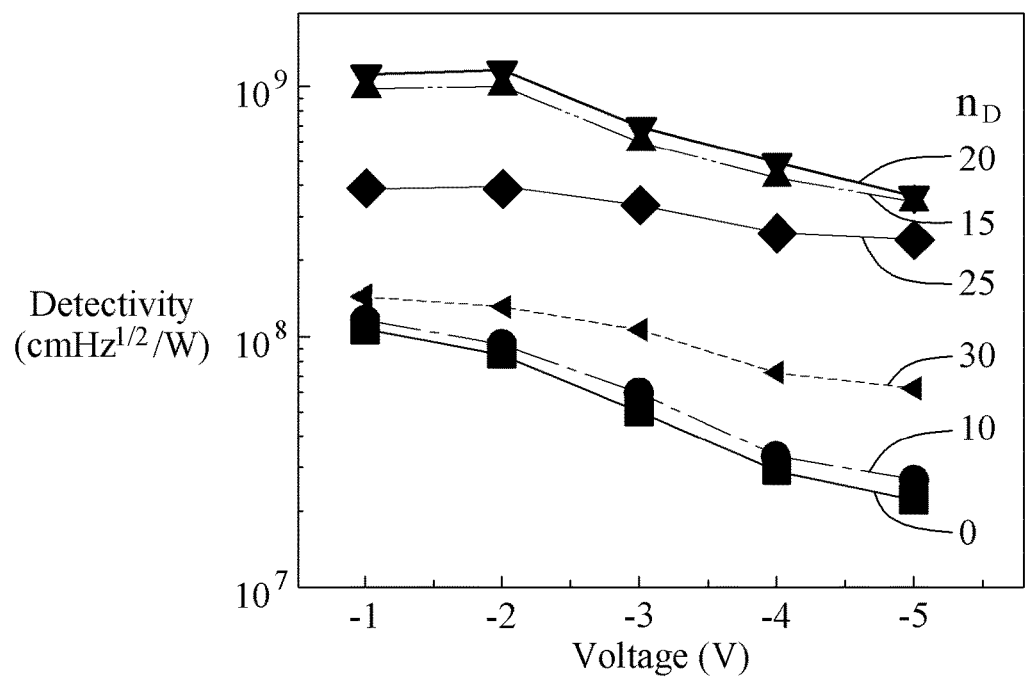
FIG. 7 is a graph showing photodetectivity of a photodiode including the graphene-silicon quantum dot hybrid structure according to an embodiment of the present disclosure, at different graphene doping concentrations.

FIG. 7 is a graph showing photodetectivity of a photodiode including the graphene-silicon quantum dot hybrid structure according to an embodiment of the present disclosure, at different graphene doping concentrations.

Referring to FIG. 7, it can be confirmed that detectivity of the photodiode including the graphene-silicon quantum dot hybrid structure according to an embodiment of the present disclosure is up to $10^9$ Jones in the visible light region and higher than that ($<10^8$ Jones) of a conventional graphene-monocrystalline silicon photodetector device.

In addition, as illustrated in FIG. 7, it can be confirmed that detectivity of the photodiode including the graphene-silicon quantum dot hybrid structure according to an embodiment of the present disclosure is highest at −1 V. This result indicates that detectivity of the photodiode including the graphene-silicon quantum dot hybrid structure of the present disclosure is highest at a much lower applied voltage than current commercial photodetector devices.

Figure 8:
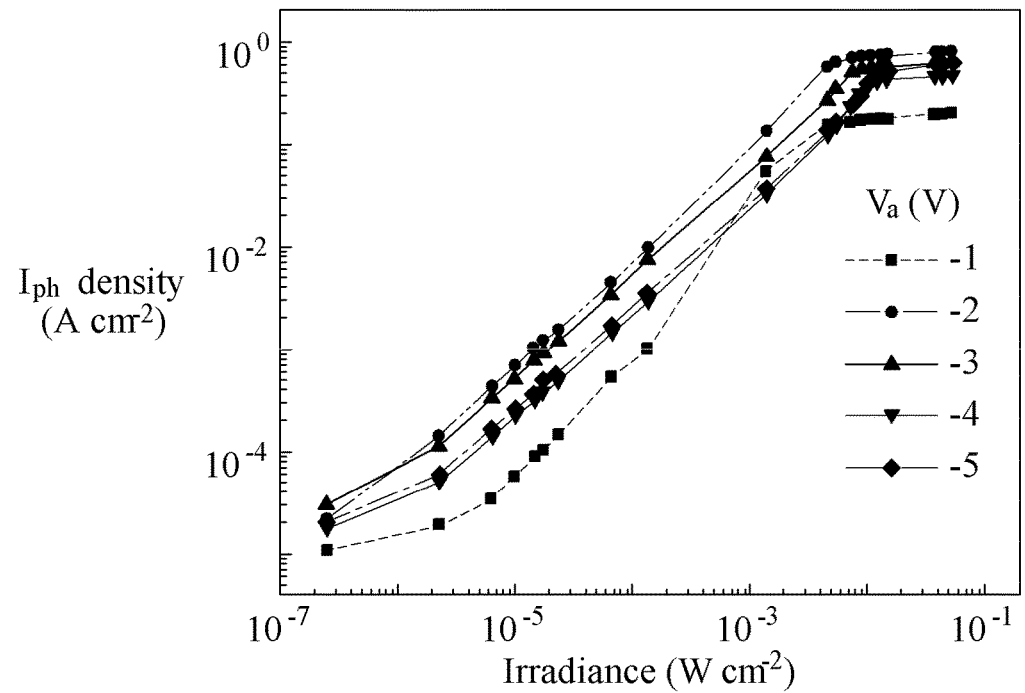
FIGS. 8 and 9 are graphs illustrating a linear dynamic range (LDR) of a photodiode including the graphene-silicon quantum dot hybrid structure according to an embodiment of the present disclosure.
Figure 9:
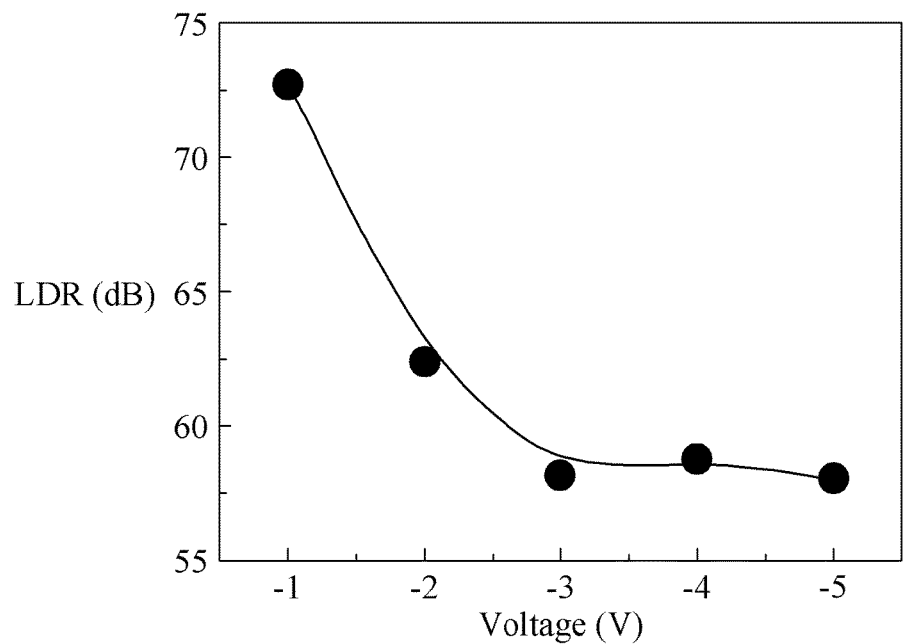

FIGS. 8 and 9 are graphs illustrating a linear dynamic range (LDR) of a photodiode including the graphene-silicon quantum dot hybrid structure according to an embodiment of the present disclosure.

Referring to FIGS. 8 and 9, to derive a linear dynamic range (LDR) of the photodiode including the graphene-silicon quantum dot hybrid structure according to an embodiment of the present disclosure, a photo current of the photodiode including the graphene-silicon quantum dot hybrid structure according to an embodiment of the present disclosure was measured while changing the intensity of a 532 nm laser.

Referring to FIG. 8, it can be confirmed that, as a measurement result of a photo current of the photodiode including the graphene-silicon quantum dot hybrid structure according to an embodiment of the present disclosure, the photo current linearly increases with increasing of the intensity of light. Here, the incline of the photo current is close to 1.

In addition, it can be confirmed that, as illustrated in FIG. 8, a range of light intensity that is able to linearly increase photo current increases with increase in an applied voltage. This result indicates that photoreaction of a device is not decreased and remains constant in a wide range from low light to strong light. More particularly, this result indicates that the photodiode including the graphene-silicon quantum dot hybrid structure according to an embodiment of the present disclosure is not limited to operation in low light or strong light and has superior performance of being able to detect light from several nW to several mW.

Referring to FIG. 9, it can be confirmed that a linear dynamic range of the photodiode including the graphene-silicon quantum dot hybrid structure according to an embodiment of the present disclosure is −1 V when an applied voltage is 73 dB. Accordingly, it can be confirmed that the photodiode exhibits superior performance in the visible light region.

Figure 10:
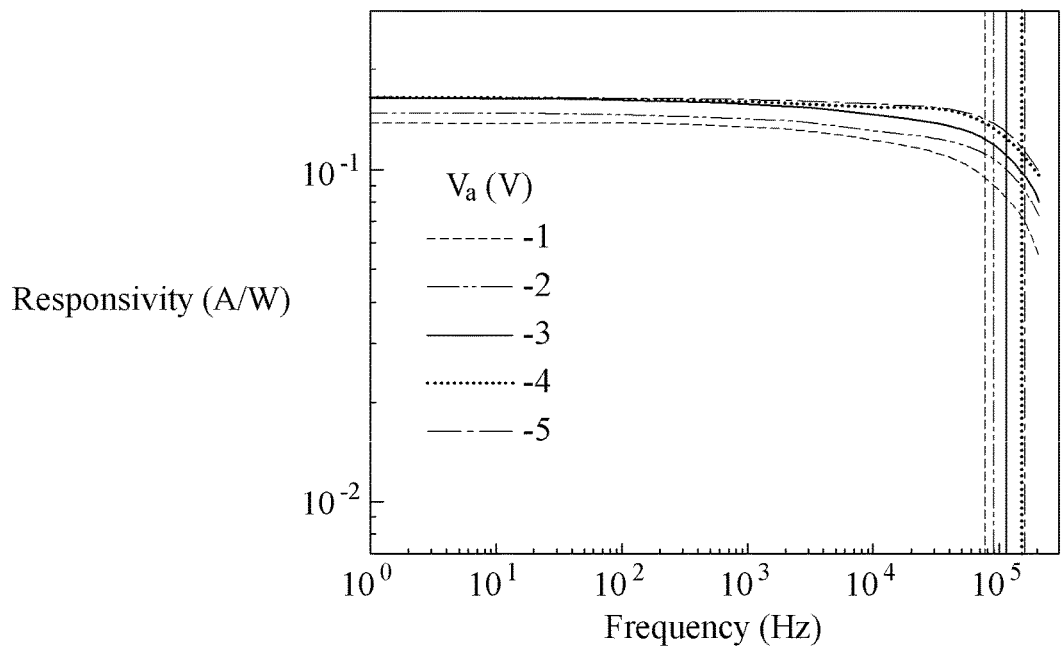
FIGS. 10 and 11 are graphs illustrating a 3-dB band width of a photodiode including the graphene-silicon quantum dot hybrid structure according to an embodiment of the present disclosure.
Figure 11:
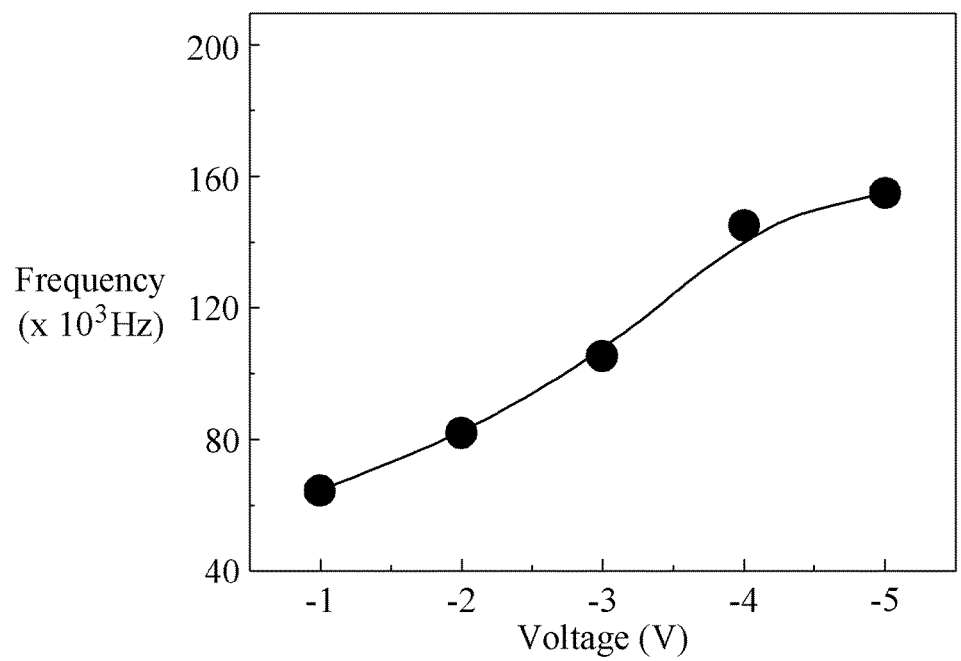

FIGS. 10 and 11 are graphs illustrating a 3-dB band width of a photodiode including the graphene-silicon quantum dot hybrid structure according to an embodiment of the present disclosure.

FIG. 10 illustrates photoresponsivity according to the frequency of a light source with respect to an applied voltage, and FIG. 11 illustrates the frequency of a light source according to an applied voltage derived from a result of FIG. 10.

From FIGS. 10 and 11, it can be confirmed that, with respect to the photodiode including the graphene-silicon quantum dot hybrid structure according to an embodiment of the present disclosure, information on an operation range for a frequency is provided from an operation range for a frequency, i.e., 3 dB band width, derived from photoresponsivity according to a change in the frequency of incident light.

Referring to FIGS. 10 and 11, it can be confirmed that, when an applied voltage is −5 V, a 3 dB band width increases up to $10^5$ Hz. Accordingly, it can be confirmed that the photodiode including the graphene-silicon quantum dot hybrid structure according to an embodiment of the present disclosure has superior sensitivity.

Figure 12:
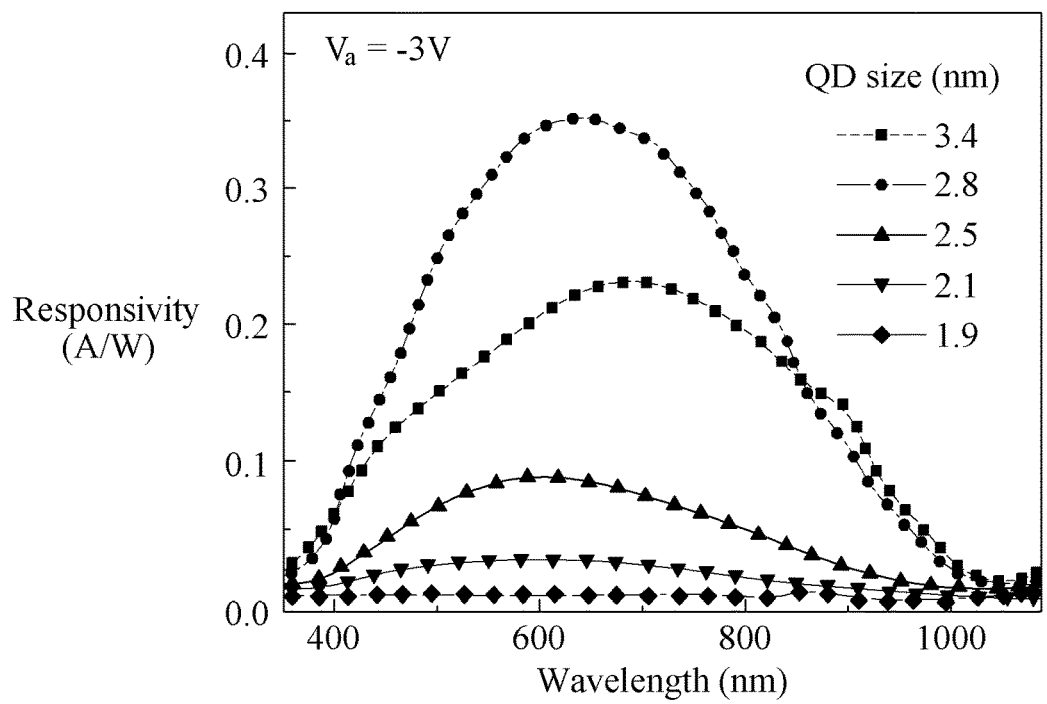
FIG. 12 illustrates photoresponsivity to a wavelength of a photodiode including the graphene-silicon quantum dot hybrid structure according to an embodiment of the present disclosure, at different sizes of silicon quantum dots.
Figure 13:
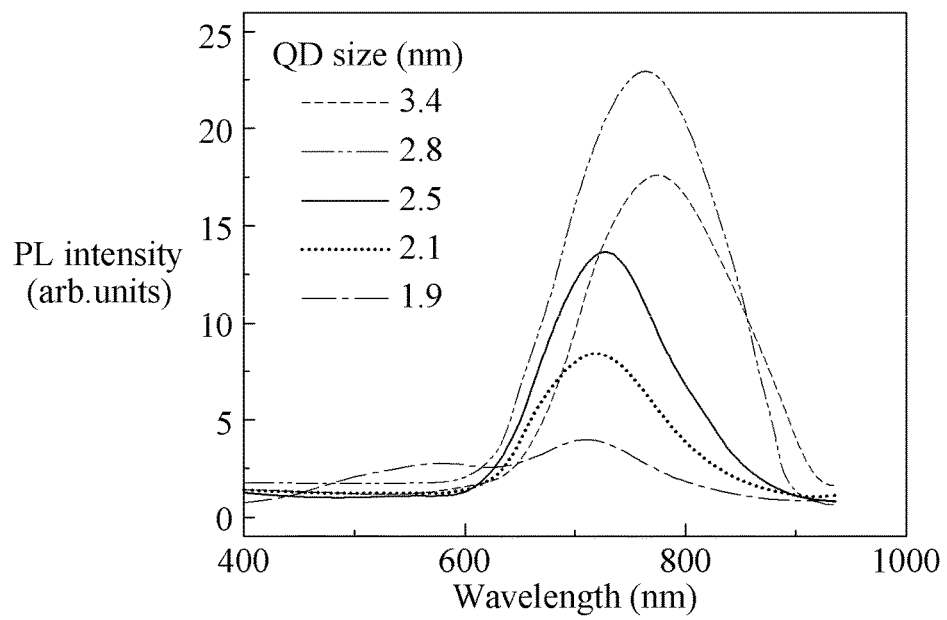
FIG. 13 illustrates photoluminescence (PL) with respect to wavelength.

FIG. 12 illustrates photoresponsivity according to wavelength of a photodiode including the graphene-silicon quantum dot hybrid structure according to an embodiment of the present disclosure, at each size of silicon quantum dots. FIG. 13 illustrates photoluminescence (PL) with respect to wavelength, and FIG. 14 is a graph showing a composite of FIGS. 12 and 13.

Figure 14:
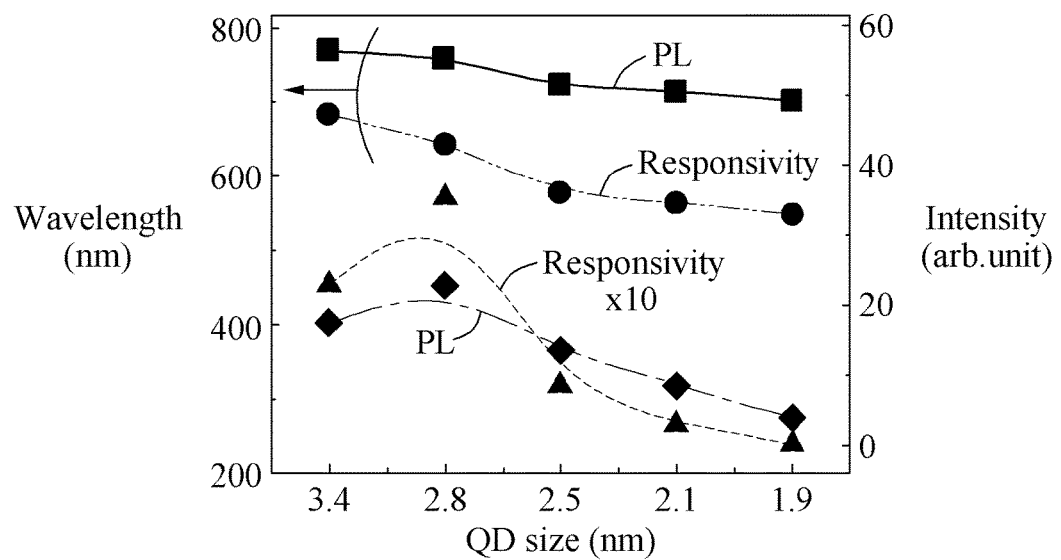
FIG. 14 is a graph showing a composite of FIGS. 12 and 13.

Referring to FIGS. 12 to 14, it can be confirmed that, a doping concentration of graphene is fixed to 20 mM, movement tendencies of photoresponsivity and photoluminescence peaks (PL peaks) according to the sizes of the silicon quantum dots are similar to each other. In addition, it can be confirmed that both the photoresponsivity and photoluminescence of the photodiode including the graphene-silicon quantum dot hybrid structure according to an embodiment of the present disclosure are blue-shifted with decrease in the size of silicon quantum dots due to quantum confinement effect.

In addition, peaks of photoluminescence are shifted toward longer wavelengths, compared to peaks of photoresponsivity, as shown in FIGS. 12 to 14, which occurs because the peaks of photoresponsivity are related to absorption.

In addition, the peaks of photoluminescence are shifted toward longer wavelengths because electrons in a valence band on an energy band are excited to a conduction band and the excited electrons are shifted and fall to an interface state of Si=O and thus energy smaller than the energy of an actual energy band gap occurs.

As shown in FIGS. 12 to 14, it can be confirmed that both the photoresponsivity and photoluminescence are highest when the size of silicon quantum dots is 2.8 nm. This occurs because defects are small compared to the surface area of the silicon quantum dots.

In addition, the photodiode including the graphene-silicon quantum dot hybrid structure according to the present disclosure exhibits the best characteristics when the size of the silicon quantum dot is 2.8 nm and a doping concentration of $AuCl_3$ of graphene is 20 mM.

Figure 15:
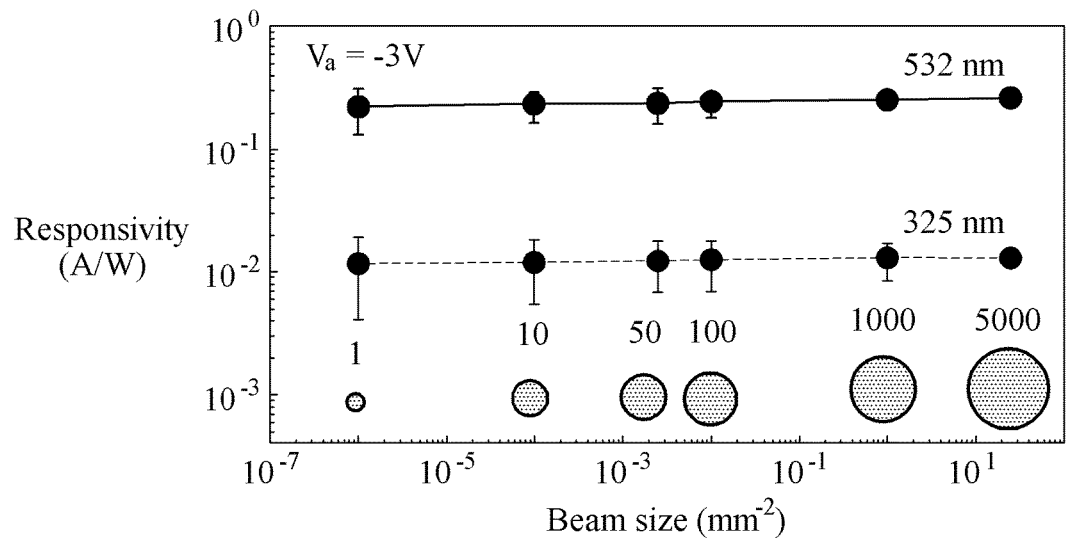
FIG. 15 is a graph showing photoresponsivity, which is dependent upon the area of an active layer, of a photodiode including the graphene-silicon quantum dot hybrid structure according to an embodiment of the present disclosure.

FIG. 15 is a graph showing photoresponsivity, which is dependent upon the area of an active layer, of a photodiode including the graphene-silicon quantum dot hybrid structure according to an embodiment of the present disclosure.

In photodetector devices, it is important that photoresponsivity is maintained regardless of the sizes of devices.

Referring to FIG. 15, to investigate a change in photoresponsivity dependent upon the area of an active layer of an optimized 5 mm×5 mm sample which was derived from the photodiode including the graphene-silicon quantum dot hybrid structure of the present disclosure, the photoresponsivity was measured while varying the size of a laser beam.

In addition, the wavelengths of the lasers used to measure photoresponsivity were 325 nm and 532 nm. The size of a laser beam, i.e., 10 points for the area of an active layer, was measured. Averages of measured values were calculated and results thereof are illustrated in the drawing.

Referring to FIG. 15, it can be confirmed that, although the area of an active layer of the photodiode including the graphene-silicon quantum dot hybrid structure according to an embodiment of the present disclosure is changed, photoresponsivity is maintained.

Figure 16:
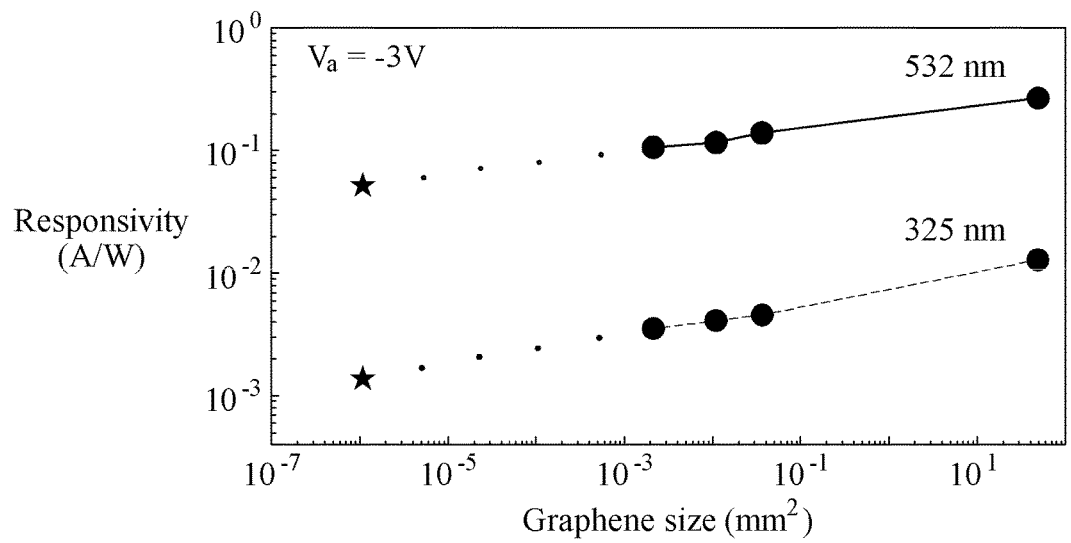
FIG. 16 is a graph showing photoresponsivity according to the sizes of photodiodes including a graphene-silicon quantum dot hybrid structure according to an embodiment of the present disclosure.

FIG. 16 is a graph showing photoresponsivity according to the sizes of photodiodes including a graphene-silicon quantum dot hybrid structure according to an embodiment of the present disclosure.

With regard to FIG. 16, wavelengths of a laser used to measure photoresponsivity are 325 nm and 532 nm.

Referring to FIG. 16, it can be confirmed that photoresponsivity decreases with decreasing size of the photodiode (the size of graphene) including the graphene-silicon quantum dot hybrid structure of the present disclosure, but the photoresponsivity does not greatly decrease although the size of the photodiode decreases.

Figure 17:
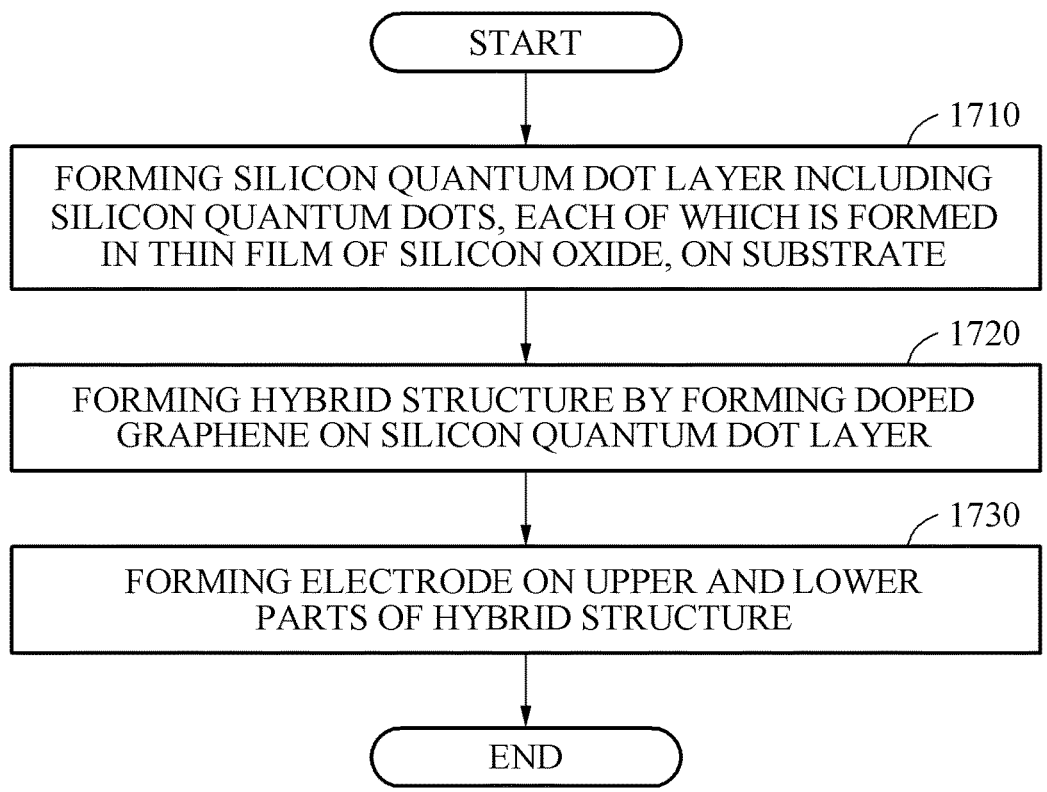
FIG. 17 is a flowchart showing a method of manufacturing a photodiode including the graphene-silicon quantum dot hybrid structure according to an embodiment of the present disclosure.

FIG. 17 is a flowchart showing a method of manufacturing a photodiode including the graphene-silicon quantum dot hybrid structure according to an embodiment of the present disclosure.

Referring to FIG. 17, in step 1710, a silicon quantum dot layer including silicon quantum dots, each of which is formed in a thin film of a silicon oxide, is formed on a substrate.

In step 1710, $SiO_2$ and $SiOx$ thin films are sequentially laminated on a substrate and then thermal treatment is performed at 1000° C. to 1200° C. in a nitrogen atmosphere, whereby the silicon quantum dots are formed in the $SiO_2$ thin film. Here, x may be controlled to have a value of 0.8 to 1.6 and the sizes of the silicon quantum dots may be controlled to correspond to a value of x.

At step 1720, doped graphene is formed on the silicon quantum dot layer, thereby forming a hybrid structure.

Step 1720 may include a step of forming graphene on a catalyst layer by reacting the catalyst layer with a mixed gas containing carbon and thus performing chemical vapor deposition (CND).

In addition, step 1720 may include a step of doping graphene by transferring the formed graphene onto the silicon quantum dot layer, spin-coating $AuCl_3$ at a concentration of 10 to 30 mM, and performing annealing at 90° C. to 110° C.

In step 1730, an electrode is formed on upper and lower parts of the hybrid structure.

As described above, the present disclosure provides a photodiode including a graphene-silicon quantum dot hybrid structure and a method of manufacturing the same. Accordingly, a photodiode may be easily manufactured and may be fabricated over a large area, the photodiode has a wide photodetection band from the ultraviolet light region to the near infrared region, and selective absorption energy control is possible.

In addition, due to provision of the photodiode including a graphene-silicon quantum dot hybrid structure and the method of manufacturing the same, the performance of the photodiode may be optimized by controlling the doping concentration of graphene and thus controlling the Fermi level of the graphene.

In addition, the present disclosure may increase the performance of the photodiode by controlling the sizes of silicon quantum dots and thus controlling the energy bandgap thereof.

Further, the present disclosure provides an ideal photodiode including a graphene-silicon quantum dot hybrid structure which may be utilized in photodiode-based optoelectronic devices.

Although exemplary embodiments of the present invention have been disclosed for illustrative purposes, those skilled in the art will appreciate that various modifications, additions and substitutions are possible, without departing from the scope and spirit of the invention as disclosed in the accompanying claims. For example, proper result may be achieved even if the techniques described above are implemented in an order different from that for the disclosed method, and/or disclosed constituents such as a system, structure, device and circuit are coupled to or combined with each other in a form different from that for the disclosed method or replaced by other constituents or equivalents.

It should be understood, however, that there is no intent to limit the invention to the embodiments disclosed, rather, the invention is to cover all modifications, equivalents, and alternatives falling within the spirit and scope of the invention as defined by the claims.

What is claimed is:

1. A photodiode comprising a graphene-silicon quantum dot hybrid structure, the photodiode comprising:
 a hybrid structure composed of a silicon quantum dot layer comprising silicon (Si) quantum dots, each of which is formed in a thin film of a silicon oxide, and doped graphene formed on the silicon quantum dot layer; and
 electrodes formed on upper and lower parts of the hybrid structure,
 wherein the silicon quantum dot layer comprises silicon quantum dots formed in a $SiO_2$ thin film by alternately and sequentially laminating $SiO_2$ and $SiO_x$ thin films on a substrate and then thermally treating the alternately and sequentially laminated $SiO_2$ and $SiO_x$ thin films,
 wherein a doping concentration of the doped graphene is controlled by coating $AuCl_3$ on a graphene and then annealing, and
 wherein optical and electrical characteristics of the photodiode are controlled according to sizes of the silicon quantum dots and a doping concentration of the doped graphene.

2. The photodiode according to claim 1, wherein the silicon quantum dot layer is formed by thermally treating the alternately and sequentially laminated $SiO_2$ and $SiO_x$ thin films at 1000° C. to 1200° C. in a nitrogen atmosphere.

3. The photodiode according to claim 1, wherein x is controlled to have a value of 0.8 to 1.6 and the sizes of the silicon quantum dots are controlled to correspond to a value of x.

4. The photodiode according to claim 3, wherein each of the $SiO_2$ and $SiO_x$ thin films is sequentially laminated 23 to 25 times to a thickness unit of 2 nm each time.

5. The photodiode according to claim 1, wherein the graphene is formed by reacting a catalyst layer with a mixed gas containing carbon and depositing a reacted product on the catalyst layer by chemical vapor deposition (CVD).

6. The photodiode according to claim 5, wherein the hybrid structure is formed by transferring the deposited graphene onto the silicon quantum dot layer.

7. The photodiode according to claim 5, wherein the doped graphene is formed by spin coating $AuCl_3$, which has a concentration of 10 to 30 mM, on the deposited graphene and performing annealing at 90° C. to 110° C.

* * * * *